(12) United States Patent
Kimura et al.

(10) Patent No.: US 7,952,054 B2
(45) Date of Patent: May 31, 2011

(54) HEATING ELEMENT

(75) Inventors: Noboru Kimura, Gunma (JP); Yoshihiro Kubota, Gunma (JP); Waichi Yamamura, Gunma (JP); Shoji Kano, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 990 days.

(21) Appl. No.: 11/783,581

(22) Filed: Apr. 10, 2007

(65) Prior Publication Data
US 2007/0241096 A1 Oct. 18, 2007

(30) Foreign Application Priority Data
Apr. 13, 2006 (JP) .................. 2006-110705

(51) Int. Cl.
*F27D 11/00* (2006.01)
*C23C 16/00* (2006.01)

(52) U.S. Cl. .............. 219/433; 219/444.1; 219/443.1; 219/390; 219/405; 219/411; 118/724; 118/725; 118/728; 118/729; 118/730; 118/50.1

(58) Field of Classification Search ............. 219/433, 219/444.1, 444.2, 390, 405, 411, 443.1; 118/724, 118/725, 50.1, 728–730
See application file for complete search history.

(56) References Cited

U.S. PATENT DOCUMENTS

| | | |
|---|---|---|
| 5,343,022 A | 8/1994 | Gilbert, Sr. et al. |
| 2002/0109955 A1 | 8/2002 | Masuda et al. |
| 2002/0185488 A1 | 12/2002 | Natsuhara et al. |
| 2004/0151839 A1 | 8/2004 | Miyaji et al. |

FOREIGN PATENT DOCUMENTS

| | | | |
|---|---|---|---|
| EP | 1753014 | * | 9/2005 |
| EP | 1604389 B1 | | 8/2009 |
| JP | A 5-109876 | | 4/1993 |
| JP | A 5-129210 | | 5/1993 |
| JP | A 6-061335 | | 3/1994 |
| JP | A-8-264550 | | 11/1996 |
| JP | A 11-354260 | | 12/1999 |
| JP | A-2002-246451 | | 8/2002 |

(Continued)

OTHER PUBLICATIONS

"Vacuum", No. 12, vol. 33, pp. 53-54, 1990.

(Continued)

*Primary Examiner* — Shawntina Fuqua
(74) *Attorney, Agent, or Firm* — Oliff & Berridge, PLC (57) ABSTRACT

There is disclosed a heating element 10 comprising: at least a heat-resistant base member 1; a conductive layer 3 having a heater pattern 3a formed on the heat-resistant base member; a protection layer 4 with an insulating property formed on the conductive layer; and a corrosion-resistant layer 4p that is an oxide having an oxygen amount of stoichiometric ratio or less formed on the protection layer. There can be provided a heating element in which a corrosion-resistant layer whose resistivity or hardness is controlled is formed on a protection layer and through which the corrosive gas is difficult to be transmitted even under an environment of a high temperature and a corrosive gas and by which degradation due to corrosion of a conductive layer, particularly, a power-supply-terminal portion can be avoided and additionally which can fulfill a high function as an electrostatic chuck even when having a chuck pattern and which has a long operation life and is capable of being produced at a low cost.

44 Claims, 4 Drawing Sheets

FOREIGN PATENT DOCUMENTS

| | | |
|---|---|---|
| JP | A-2004-211166 | 7/2004 |
| JP | A-2005-057214 | 3/2005 |
| TW | 541640 | 7/2003 |
| TW | M267790 | 6/2005 |
| TW | I242795 | 11/2005 |
| TW | I246710 | 1/2006 |
| WO | WO 2004/068541 A2 | 8/2004 |
| WO | WO 2004/084280 A2 | 9/2004 |

OTHER PUBLICATIONS

Taiwanese Office Action for Taiwanese Application No. 096106788, issued Apr. 21, 2010.

Notification of Reasons for Refusal for Japanese Application No. 2006-110705, issued on Jun. 8, 2010.

* cited by examiner

HEATING ELEMENT

BACKGROUND OF THE INVENTION

1. Field of the Invention

The present invention relates to a heating element at least including, a heat-resistant base member, a conductive layer having a heater pattern formed on the heat-resistant base member, and a protection layer with an insulating property formed on the conductive layer.

2. Description of the Related Art

A heater in which a line or foil of metal having a high melting point such as molybdenum or tungsten is wrapped around or bonded to a heat-resistant base member made of sintered ceramic such as alumina, aluminum nitride or zirconia has been used for heating semiconductor wafers in manufacturing steps of semiconductor devices.

However, such a heater has drawbacks of being prone to deform or vaporize because the heating element is made of metal, being short-life, and being complicated to assemble (see, the pyrolytic graphite/pyrolytic boron nitride heater from Union Carbide Services provided in "Vacuum" No. 12, (33), p. 53). Furthermore, use of sintered ceramic for the heat-resistant base member causes a problem that the binder in the sintered ceramic becomes impurities.

Then, to prevent such deformation or scattering of impurities due to a heat cycle, a ceramic heater is developed. The ceramic heater has a heat-resistant base member of pyrolytic boron nitride (PBN) having high mechanical strength and enabling high-efficiency heating, and a conductive layer of pyrolytic graphite on the heat-resistant base member (for example, see the pyrolytic graphite/pyrolytic boron nitride heater from Union Carbide Services provided in "Vacuum" No. 12, (33), p. 53; U.S. Pat. No. 5,343,022; Japanese Patent Laid-open (Kokai) No. 05-129210; and Japanese Patent Laid-open (Kokai) No. 06-61335).

Figure 4:
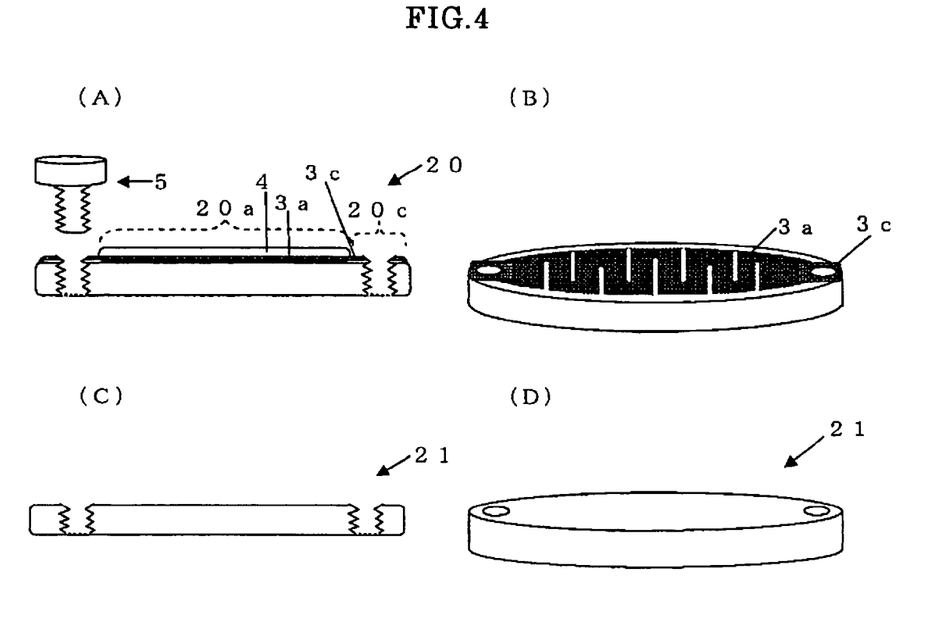
FIG. 4 is a schematic view of an example (Comparative example) of a conventional heating element; (A) A section view of the heating element; (B) A perspective view showing the entirety of a part in which a conductive layer is formed on a heat-resistant base member; (C) A section view of the heat-resistant base member; (D) A perspective view of the heat-resistant base member.

An example of a heating element of such a heater is shown in FIG. 4. A heating element 20 has at least a heating portion 20a in which a heater pattern 3a is formed on a plate-shaped heat-resistant base member 21, and a power-supply-terminal portion 20c in which power-supply terminals 3c are formed at the rim of the surface of the heat-resistant base member 21 on which the heater pattern is formed. A protection layer 4 with an insulating property is formed on the heater pattern 3a. To the power-supply terminal 3c, a power-supply member or a power terminal 5 is connected.

However, pyrolytic graphite used for the heating body is prone to undergo corrosion due to oxidation. Pyrolytic graphite has also reactivity with high-temperature gases used in the heating process. For example, hydrogen gas changes pyrolytic graphite into methane gas. Therefore, there is a problem that remaining oxygen or high-temperature gases in the process environment corrodes pyrolytic graphite in the power-supply-terminal portion exposed for power supply, and the power-supply-terminal portion is short life.

To solve the problem, an attempt to locate the power-supply-terminal portion away from the heating portion is made. For example, the following solution is suggested: a power-supply terminal is connected to a power-terminal member via a power-supply member having a heater pattern which produced heat by turning on electricity. Insulating ceramic such as PBN is used for a protection layer covering the heater pattern, thereby preventing overheating of the power-supply-terminal portion to increase longevity of the power-supply terminal (see, Japanese Patent Laid-open (Kokai) No. 11-354260).

Furthermore, the following method is suggested: assembling the power-supply-terminal portion made of carbon with an assembly part and forming a protection layer (see, U.S. Pat. No. 5,343,022; International Publication WO2004/068541).

However, such a heating element has protrusions on the heating surface. It is necessary to provide a space between the heating surface and an object to be heated, which hampers compact design of the heating element. In addition, a protection layer in the vicinity of a connected part-assembled from plural components is apt to produce cracks through usage. A conductive layer begins to corrode from the cracks, which causes a problem to shorten the life of the heating element.

Furthermore, when the heating element is used in an environment corroding boride such as using a halide etching gas, there is a drawback that an outermost layer of boride lacks resistance to corrosion, and corrosion of the outermost layer shortens the life of the heating element.

Moreover, an advanced ceramic heater with electrostatic chuck on a heater for holding a semiconductor wafer serving as the object to be heated thereonto has been suggested currently (see, Japanese Patent Laid-open (Kokai) No. 05-129210; Japanese Patent Laid-open (Kokai) No. 06-61335; Japanese Patent Laid-open (Kokai) No. 05-109876). However, occasionally, chuck capability is not exerted sufficiently according to resistivity of the protection layer or the chucked wafer is damaged or cracked. Moreover, heat-resistance and corrosion-resistance of the heater is also insufficient in the same manner as described above.

SUMMARY OF THE INVENTION

The present invention has been accomplished to solve the above-mentioned problems, and an object of the present invention is to provide a heating element in which a corrosion-resistant layer whose resistivity or hardness is controlled is formed on a protection layer and through which the corrosive gas is difficult to be transmitted even under an environment of a high temperature and a corrosive gas and by which degradation due to corrosion of a conductive layer, particularly, a power-supply-terminal portion can be avoided and additionally which can fulfill a high function as an electrostatic chuck even when having a chuck pattern and which has a long operation life and is capable of being produced at a low cost.

To achieve the above object, the present invention provides a heating element comprising: at least
  a heat-resistant base member;
  a conductive layer having a heater pattern formed on the heat-resistant base member;
  a protection layer with an insulating property formed on the conductive layer; and
  a corrosion-resistant layer that is an oxide having an oxygen amount of stoichiometric ratio or less formed on the protection layer.

When the heating element has a corrosion-resistant layer that is an oxide having an oxygen amount of stoichiometric ratio or less on the protection layer formed on the conductive layer having a heater pattern as described above, degradation due to corrosion of a conductive layer, particularly, a power-supply-terminal portion can be avoided even under an environment of a high temperature and a corrosive gas, and the heating element comes to have a long operation life.

Moreover, if a corrosive gas is prevented by forming a corrosion-resistant layer for the outermost layer, in the case of using the heating element as an electrostatic chuck, resistivity of the corrosion-resistant layer is too high not to exert the chuck capability. However, when the heating element having a corrosion-resistant layer that is an oxide having an oxygen amount of stoichiometric ratio or less is used as a electrostatic chuck, its resistivity and its hardness can be controlled and the corrosion-resistant layer can be set to have a low resistivity, and therefore, can exert a high chuck capability, and the chucked wafer can be prevented from being damaged or broken.

In this case, it is preferable that on an opposite surface to a surface of the heat-resistant base member on which the heater pattern is formed, an electrostatic chuck pattern for holding an object to be heated is formed, and on the electrostatic chuck pattern, the protection layer and the corrosion-resistant layer are formed.

When an electrostatic chuck pattern for holding an object to be heated is formed on an opposite surface to a surface of the heat-resistant base member on which the heater pattern is formed and the protection layer and the corrosion-resistant layer are formed on the electrostatic chuck pattern, the heating element can more effectively exert a high chuck capability and therefore, can hold and efficiently heat the object to be heated, and therewith a position thereof can be high-precisely set. In such a case in which precision of the position of the object to be heated is required as ion implantation, plasma etching, sputtering, and so forth, a desired heating process can be performed more accurately.

Moreover, it is preferable that the oxide is any one of an oxide of aluminum, an oxide of yttrium, and an oxide of silicon, or a combination of any two or more of those.

When the oxide is any one of an oxide of aluminum, an oxide of yttrium, and an oxide of silicon, or a combination of any two or more of those as described above, the heating element can be stably used even under a corrosive environment such as a halide etching gas or oxygen.

Furthermore, it is preferable that when the stoichiometric ratio of oxygen of the oxide is set to 1, the oxygen amount is 0.6 or more and less than 1.

When the stoichiometric ratio of oxygen of the oxide is set to 1, if the oxygen amount is 0.6 or more and less than 1 as described above, the corrosion-resistant layer has a sufficient strength and a sufficient electrostatic chuck capability.

Moreover, it is preferable that the corrosion-resistant layer is formed by any one of CVD method, spraying method, reactive sputtering method, and sol-gel method, or a combined method of those.

When the corrosion-resistant layer is formed by any one of CVD method, spraying method, reactive sputtering method, and sol-gel method, or a combined method of those as described above, the corrosion-resistant layer having a high corrosion resistance can be formed at a low cost.

Furthermore, it is preferable that the corrosion-resistant layer is treated with an atmosphere containing a reducing gas.

When the corrosion-resistant layer is treated with an atmosphere containing a reducing gas as described above, the corrosion-resistant layer can be set to the oxide having an oxygen amount of stoichiometric ratio or less.

Moreover, it is preferable that surface roughness Ra of an outermost surface of the corrosion-resistant layer is 1 μm or less.

When surface roughness Ra of an outermost surface of the corrosion-resistant layer is 1 μm or less as described above, the surface roughness of the outermost surface becomes sufficiently small, and therefore, a contact area between the corrosion-resistant layer and the object to be heated becomes larger, and the object to be heated can be adsorbed and held stably on the corrosion-resistant layer without being damaged.

Furthermore, it is preferable that resistivity of an outermost surface of the corrosion-resistant layer is $10^8$~$10^{13}$ Ω·cm (room temperature).

When resistivity of an outermost surface of the corrosion-resistant layer is $10^8$~$10^{13}$ Ω·cm (room temperature) as described above, in the case of using the heating element as an electrostatic chuck, the heating element has a high chuck capability and also has no leak current.

Moreover, it is preferable that a Vickers hardness of an outermost surface of the corrosion-resistant layer is 1 GPa to 8 GPa.

When a Vickers hardness of an outermost surface of the corrosion-resistant layer is 1 GPa to 8 GPa as described above, the hardness of the outermost surface is sufficiently small, and the object to be heated is not damaged and the outermost surface has a sufficient hardness so as not to be worn away and therefore, the wafer can be stably put or adsorbed on the corrosion-resistant layer.

Furthermore, it is preferable that the protection layer is made of any one of boron nitride, pyrolytic boron nitride, silicon nitride, CVD silicon nitride, aluminum nitride, and CVD aluminum nitride, or a combination of any two or more of those.

When the protection layer is made of any one of boron nitride, pyrolytic boron nitride, silicon nitride, CVD silicon nitride, aluminum nitride, and CVD aluminum nitride, or a combination of any two or more of those as described above, the protection layer can protect the conductive layer by a high insulating property, and also have no delamination and no scattering of impurities in use at a high temperature, and can be used in a heating process in which a high purity is required, at a low cost.

Moreover, it is preferable that the conductive layer is made of pyrolytic carbon or grassy carbon.

When the conductive layer is made of pyrolytic carbon or grassy carbon, the conductive layer comes to be capable of being heated to a high temperature, and the conductive layer is easy to be processed and therefore the heater comes to make it easy that the heater pattern is set to have a meandering pattern and width, thickness, and so forth thereof are changed and thereby to make a discretionary temperature gradient therein or to make a heating distribution therein according to the heat environment to uniform the heat.

Moreover, it is possible that the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;

a dielectric layer with an insulating property is formed on a surface of the heat-resistant base member;

the conductive layer is formed on the dielectric layer; and the protection layer is integrally formed so as to cover surfaces of the heater pattern and the current-carrying part.

When the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed, the heating portion in which the heater pattern is formed on the plate portion and the power-supply-terminal portion in which the power-supply terminal is formed in the end portion are separated by the conductive portion in which the current-carrying part is formed on the rod portion. Therefore, the power-supply-terminal portion comes to have a low temperature and becomes difficult to be worn away by a high-temperature gas in the process and the heating element has a long operation life.

Moreover, because the heat-resistant base member is a single piece and is not assembled by combining a plurality of components, the member is compact and is produced at a low cost, and additionally, the layer(s) formed on the heat-resistant base member become(s) difficult to be cracked by use and comes to have a long operation life.

Furthermore, in the conductive layer, as described above, the heater pattern, the current-carrying part, and the power-supply terminal are formed and therefore, surfaces of the heater pattern and the current-carrying part are covered with the protection layer and the corrosion-resistant layer, and the conductive layer is integrally formed. Therefore, the heating element is compact and is produced at a low cost and additionally the protection layer becomes difficult to be cracked by use and has a long-operation life.

Furthermore, it is preferable that the heat-resistant base member is made of graphite.

When the heat-resistant base member is made of graphite as described above, the material is inexpensive and easy to be processed even in a complex shape and therefore, the production cost can be lower and also its heat-resistance is large.

Moreover, it is preferable that the dielectric layer is made of any one of boron nitride, pyrolytic boron nitride, silicon nitride, CVD silicon nitride, aluminum nitride, and CVD aluminum nitride, or a combination of any two or more of those.

When the dielectric layer is made of any one of boron nitride, pyrolytic boron nitride, silicon nitride, CVD silicon nitride, aluminum nitride, and CVD aluminum nitride, or a combination of any two or more of those as described above, its insulating property is high and there is no scattering of impurities in use at a high temperature and the heating element can also be used in a heating process in which high purity is required.

Furthermore, it is preferable that a length of the rod portion is 10~200 mm.

When a length of the rod portion is 10~200 mm, a sufficient distance between the terminal portion and the heating portion can be provided, and therefore, the terminal portion can have a sufficient low temperature, and the terminal portion can be more effectively prevented from being worn away.

Moreover, it is preferable that the heater pattern is formed on the surface of that side of the plate portion from which the rod portion projects, and the electrostatic chuck pattern for holding an object to be heated is formed on the surface in the opposite side of the plate portion.

When the heater pattern is formed on the surface of that side of the plate portion from which the rod portion projects, and the electrostatic chuck pattern for holding an object to be heated is formed on the surface in the opposite side of the plate portion, an object to be heated can be held and heated and therefore, the heating can be efficiently performed and the position of the object to be heated can be set high-precisely, and in such a case in which precision of the position of the object to be heated is required as ion implantation, plasma etching, sputtering, and so forth, a desired heating process can be performed more accurately. Furthermore, the heating element has an advantage that degradation of the terminal portion can be also prevented as described above.

As described above, according to the present invention, there can be provided a heating element in which a corrosion-resistant layer whose resistivity or hardness is controlled is formed on a protection layer and through which the corrosive gas is difficult to be transmitted even under an environment of a high temperature and a corrosive gas and by which degradation due to corrosion of a conductive layer, particularly, a power-supply-terminal portion can be avoided and which has a long operation life.

Moreover, in the case of using the heating element as an electrostatic chuck, its resistivity can be low and the heating element can exert a high chuck capability and additionally is difficult to damage the object to be heated.

Furthermore, when the heating portion and the power-supply-terminal portion are separated by the conductive portion in which the current-carrying part on the rod portion, the power-supply-terminal portion comes to have a low temperature and becomes difficult to be worn away by a high-temperature gas in the process and comes to have a long operation life.

DETAILED DESCRIPTION OF THE PREFERRED EMBODIMENTS

In the case in which a conventional heating element is used in an environment of corroding boride such as using a halide etching gas, there is a drawback that an outermost layer of a protection layer of boride lacks resistance to corrosion, and corrosion of the outermost layer shortens the life of the heating element.

Therefore, a film that is resistant to corrosion such as yttria and aluminum nitride has been formed thereon. However, in the case in which this is attempted to be used as an electrostatic chuck, its resistivity is too high to obtain a sufficient chuck force and therefore, there have been problems of detachment failure due to residual charge, damaging of an object to be electrostatically adsorbed by a wearing phenomenon by friction with the object to be electrostatically adsorbed, and so forth.

Accordingly, the present inventors has thoroughly investigated and found that when a heating element comprises, at least, a heat-resistant base member, a conductive layer having a heater pattern formed on the heat-resistant base member, a protection layer with an insulating property formed on the conductive layer, and a corrosion-resistant layer that is an oxide having an oxygen amount of stoichiometric ratio or less formed on the protection layer, a corrosion-resistant layer whose resistivity or hardness is controlled can be formed on a protection layer and, the corrosive gas can be difficult to be transmitted therethrough even under an environment of a high temperature and a corrosive gas and, degradation due to corrosion of a conductive layer, particularly, a power-supply-terminal portion can be avoided and additionally, the heating element can have a high function as an electrostatic chuck and has a long operation life and is capable of being produced at a low cost. The present invention has been accomplished.

Figure 1:
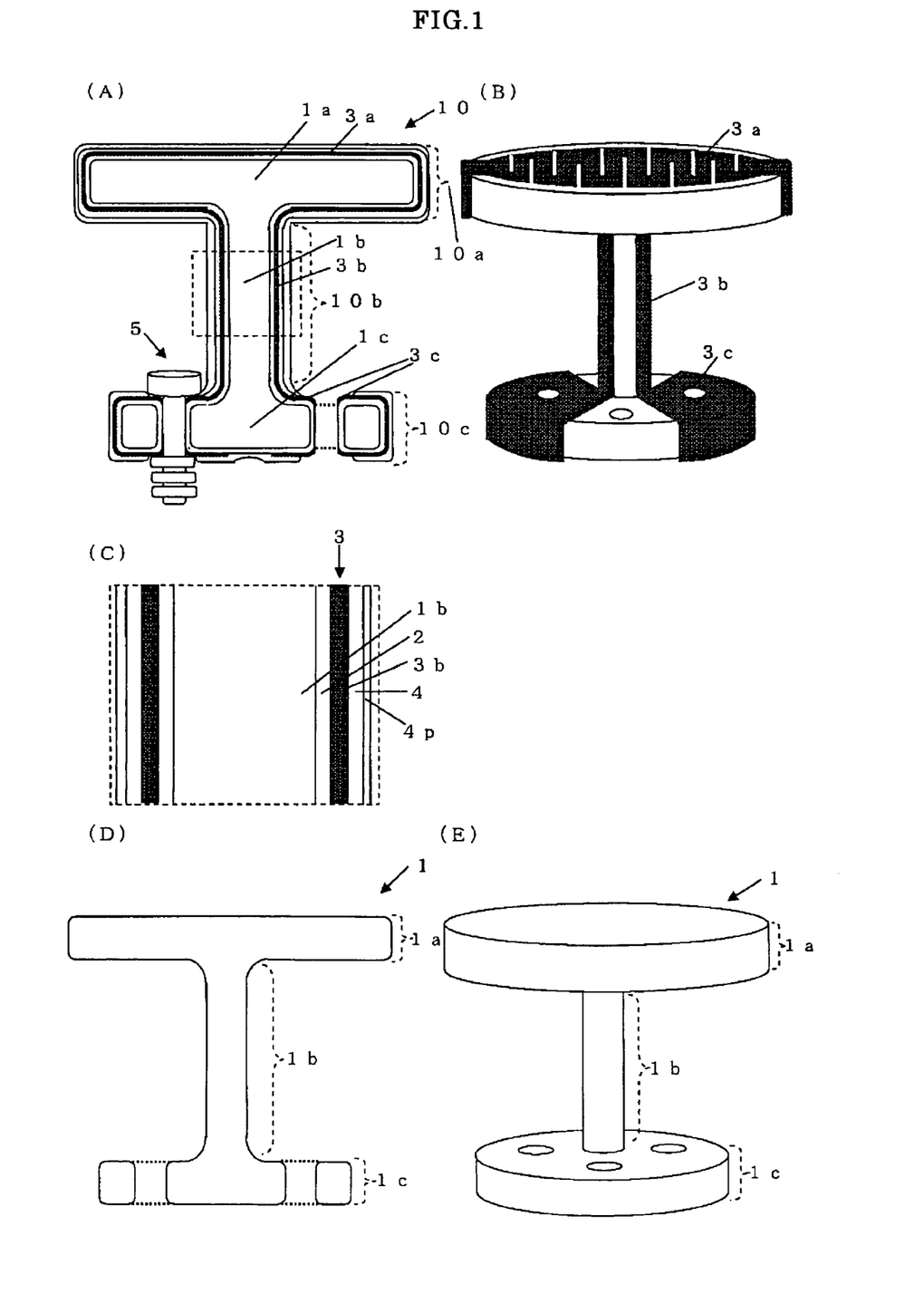
FIG. 1 is a schematic view showing an example (Example 1) of the heating element according to the present invention; (A) A section view of the heating element; (B) A perspective view showing the heating element from which the protection layer and the corrosion-resistant layer are removed; (C) An enlarged view of a partial section view (in the dot line portion of FIG. 1(A)) of the conductive portion of the heating element; (D) A section view of the heat-resistant base member; (E) A perspective view of the heat-resistant base member.
Figure 2:
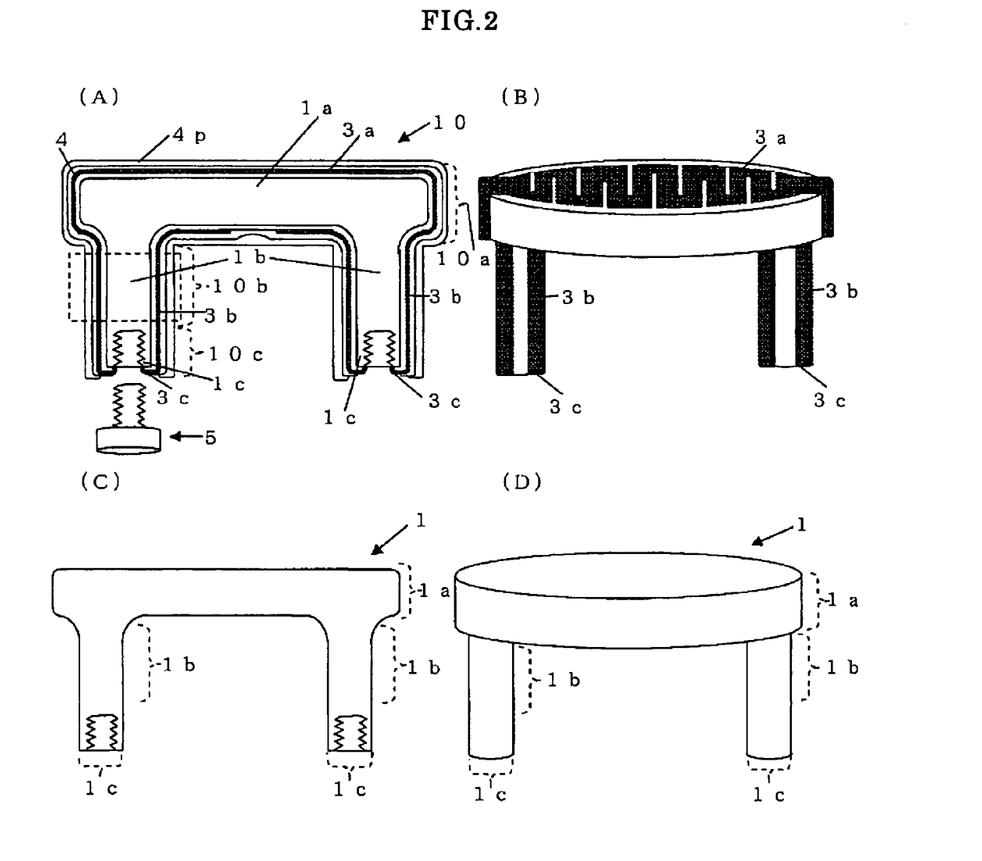
FIG. 2 is a schematic view showing another example (Example 2) of the heating element according to the present invention; (A) A section view of the heating element; (B) A perspective view showing the heating element from which the protection layer and the corrosion-resistant layer are removed; (C) A section view of the heat-resistant base member; (D) A perspective view of the heat-resistant base member.

Hereinafter, the embodiments according to the present invention will be explained in detail with reference to drawings. However, therefore, the present invention is not limited thereto. FIGS. 1 and 2 are schematic views of the heating element of the present inventions.

The heating element 10 of the present invention comprises: at least a heat-resistant base member 1;

a conductive layer 3 having a heater pattern 3a formed on the heat-resistant base member;

a protection layer 4 with an insulating property formed on the conductive layer; and a corrosion-resistant layer 4p that is an oxide having an oxygen amount of stoichiometric ratio or less formed on the protection layer.

When the heating element 10 has a corrosion-resistant layer 4p that is an oxide having an oxygen amount of stoichiometric ratio or less on the protection layer 4 formed on the conductive layer having a heater pattern 3a as described above, degradation due to corrosion of a conductive layer, particularly, a power-supply-terminal portion can be avoided even under an environment of a high temperature and a corrosive gas, and the heating element comes to have a long operation life and to be produced at a low cost.

Moreover, conventionally when the outermost surface layer is boride, there is a drawback that the outermost surface layer is corroded and comes to have a short operation life because its corrosion resistance is poor, and therefore, a film that is resistant to corrosion such as yttria and aluminum nitride is formed thereon. However, in the case in which this is attempted to be used as an electrostatic chuck, its resistivity is too high to obtain sufficient chuck force and therefore, there have been problems of detachment failure due to residual charge, wearing phenomenon by friction with the object to be electrostatically adsorbed, damaging of the object to be electrostatically adsorbed because of its high hardness, and so forth.

However, in the case that as described above, heating element having a corrosion-resistant layer 4p that is an oxide having an oxygen amount of stoichiometric ratio or less is used as an electrostatic chuck, its resistivity can be controlled by controlling the oxygen amount, and particularly, the resistivity can be lower than that of the case in which the oxygen amount is set to the stoichiometric ratio, and the heating element can exert an electrostatic chuck capability of a high Johnson-Rahbek force. Moreover, the hardness of the corrosion-resistant layer can be reduced and the wafer can be difficult to be damaged.

Here, the oxygen amount of stoichiometric ratio or less is defined that an actual oxygen amount B is smaller than its stoichiometric ratio b, where a stoichiometric ratio of $X_aO_b$ that is an oxide of X is represented by a:b and a ratio of an actual amount of the X and the oxygen amount B is represented by a:B.

For example, when the stoichiometric ratio b of oxygen of the oxide of the corrosion-resistant layer 4p is set to 1, it is preferable that the oxygen amount B is 0.6 or more and less than 1. Thereby, the corrosion-resistant layer 4p has a sufficient electrostatic chuck capability because the oxygen amount B is, for example, 0.999 or less, and the layer has a sufficient strength because more than 0.6. Furthermore, it is preferable that the oxygen amount B is 0.7~0.99 because the layer has a better strength and a better electrostatic chuck capability.

It is preferable that the oxide of the corrosion-resistant layer 4p is any one of an oxide of aluminum, an oxide of yttrium, and an oxide of silicon, or a combination of any two or more of those. Thereby, the heating element can be stably used even under a corrosive environment such as a halide etching gas or oxygen.

Moreover, the corrosion-resistant layer 4p is not limited to the case of being only one layer, and can be set to be made of a plurality of layers and thereby the corrosion resistance and the electrostatic chuck function can be further higher.

It is preferable that the corrosion-resistant layer 4p is formed by any one of CVD method, spraying method, reactive sputtering method, and sol-gel method, or a combined method of those. Thereby, the corrosion-resistant layer having a high corrosion resistance can be formed at a low cost.

For example, in the case of forming an yttria layer by CVD method, a compound having an appropriate vapor pressure or an appropriate sublimation pressure may be used as the gas material. For example, an oxide film may be formed under an atmospheric air by carrying yttrium 2-ethylhexanoate, yttrium dipivaloylmethanate, and so forth, in argon, nitrogen, and so forth, and using an oxygen-hydrogen flame. Or, the substrate is heated to 500° C. and a sublimation gas may be blown thereto under an atmosphere containing oxygen.

Moreover, when an yttria layer is formed by sol-gel method, a uniform yttria layer can be obtained by applying an yttria-sol solution to the substrate and then drying it and then calcining it. The yttria-sol solution is not limited as long as a sol solution having a compound containing yttria and a known sol solution can be used. For example, there can be exemplified an yttria-sol solution obtained by solving a component containing a predetermined amount of yttrium in a solvent, furthermore adding water and an acid therein, setting the temperature to be constant, and preparing it. A specific example of the compound includes yttrium compounds such as, yttrium halides such as yttrium chloride, yttrium subhalide yttrium organic acid, yttrium alkoxide, and yttrium complex.

It is preferable that the corrosion-resistant layer 4p is treated with an atmosphere containing a reducing gas. Thereby, the corrosion-resistant layer can be set to the oxide having an oxygen amount of stoichiometric ratio or less.

The treatment with an atmosphere containing a reducing gas can be performed by introducing an atmosphere containing a reducing gas when the corrosion-resistant layer is formed by the CVD method, spaying method, reactive sputtering method, sol-gel method, or the like.

Moreover, the treatment with a reducing gas can also be performed by heat treatment with a reducing atmosphere after forming the corrosion-resistant layer. When the heat treatment is performed in the state that the corrosion-resistant layer is set to be in contact with or contiguous to a surface of the chemical element (metal) composing the oxide of the corrosion-resistant layer or a surface of a same kind of compound having the small number of oxygen, the reducing can be more effectively performed.

Figure 3:
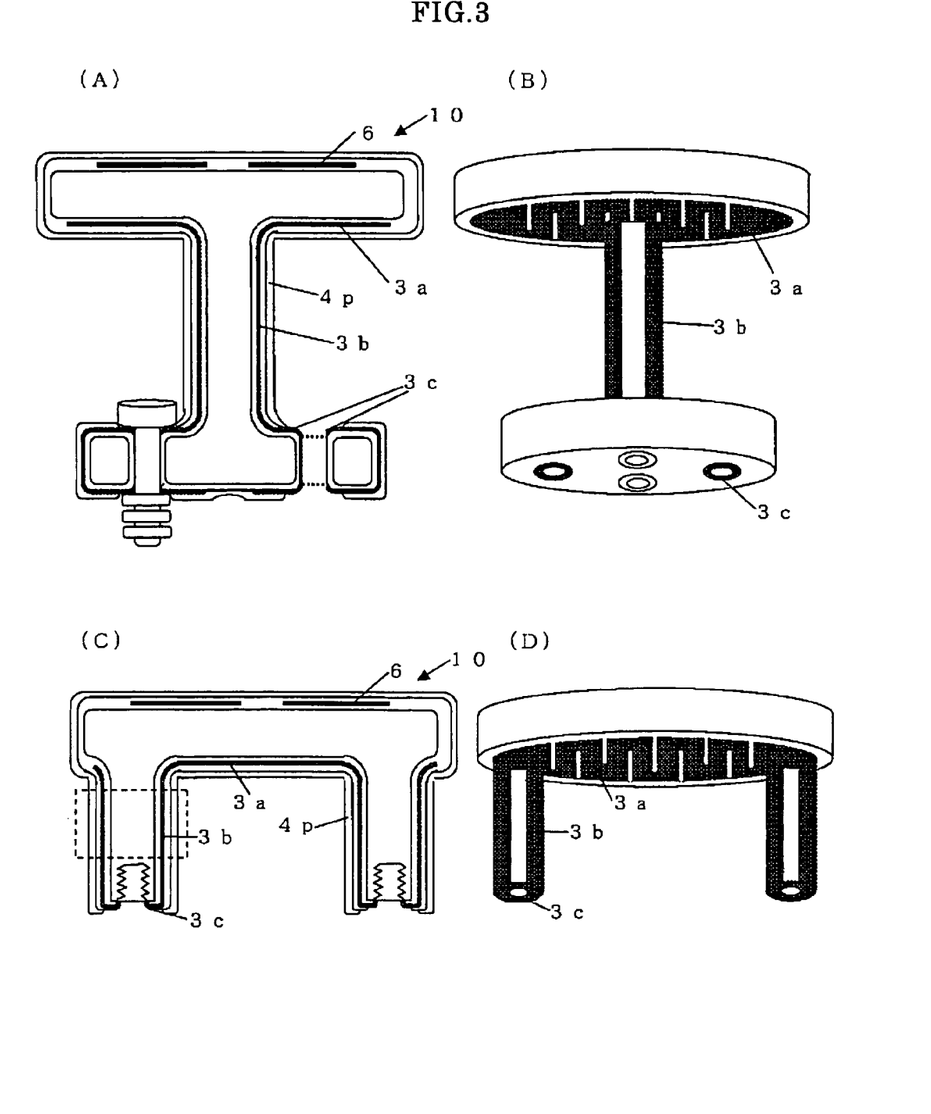
FIG. 3 is a schematic view of an example of the heating element according to the present invention in which the electrostatic chuck pattern is formed; (A)(C) Section views of the heating element; (B)(D) Perspective views from below of the heating element from which the corrosion-resistant layer and the protection layer are removed.

Furthermore, as shown in FIG. 3(A)(C), it is preferable that on an opposite surface to a surface of the heat-resistant base member on which the heater pattern 3a is formed, an electrostatic chuck pattern 6 for holding an object to be heated is formed, and on the electrostatic chuck pattern 6, the protection layer 4 and the corrosion-resistant layer 4p are formed.

Thereby, the heating element can effectively exert a high chuck capability and therefore, can hold and efficiently heat the object to be heated, and therewith a position thereof can be high-precisely set. In such a case in which precision of the position of the object to be heated is required as ion implantation, plasma etching, sputtering, and so forth, a desired heating process can be performed more accurately.

The pattern shape of the electrostatic chuck includes, for example, comb-tooth shape, convolution shape, concentric circular shape, semicircular shape, lattice shape, wedgy shape, and so forth.

Moreover, it is preferable that surface roughness Ra of an outermost surface of the corrosion-resistant layer 4p is 1 μm or less. Thereby, the surface roughness of the outermost surface becomes sufficiently small, and therefore, a contact area between the corrosion-resistant layer and the object to be heated becomes larger, and the object to be heated can be adsorbed and held stably on the corrosion-resistant layer without being damaged.

Furthermore, it is preferable that resistivity of an outermost surface of the corrosion-resistant layer 4p is $10^8 \sim 10^{13}$ Ω·cm (room temperature). Thereby, in the case of using the heating element as an electrostatic chuck, the heating element has a high chuck capability and also has no leakage current.

Moreover, it is preferable that a Vickers hardness of an outermost surface of the corrosion-resistant layer 4p is 1 GPa to 8 GPa. Thereby, the hardness of the outermost surface is sufficiently small and therefore, the object to be heated is not damaged and the outermost surface has a sufficient hardness so as not to be worn away and therefore, the wafer can be stably put on the corrosion-resistant layer.

The surface roughness, the resistivity, and the hardness can be controlled by adjusting the oxygen amount in the oxide.

Furthermore, it is preferable that the protection layer 4 is made of any one of boron nitride, pyrolytic boron nitride, silicon nitride, CVD silicon nitride, aluminum nitride, and CVD aluminum nitride, or a combination of any two or more of those. By setting the protection layer to be made of an insulating material that does not contain metal causing a short circuit as described above, the conductive layer can be protected by a high insulating property, and also have no delamination and no scattering of impurities in use at a high temperature, and can be used in a heating process in which a high purity is required, at a low cost.

It is preferable that the conductive layer 3 is made of pyrolytic carbon or grassy carbon because the conductive layer comes to be capable of being heated to a high temperature, and the conductive layer is easy to be processed and therefore the heater comes to make it easy that the heater pattern is set to have a meandering pattern or the like and width, thickness, and so forth thereof are changed and thereby to make a discretionary temperature gradient therein or to make a heating distribution therein according to the heat environment to uniform the heat. In particular, pyrolytic graphite is more preferable because the layer can be produced at a low cost. However, the layer may be made of another material as long as a material having a high heat-resistance that can generate heat by turning on electricity. The shape of the heater pattern is not limited to such a meandering pattern (zigzag pattern) as shown in FIG. 1 and, for example, a convolution pattern having a concentric circular shape is possible.

The heater pattern 3a is formed on the plate portion 1a between the dielectric layer 2 and the protection layer 4, and by generating heat by turning on electricity, sufficient heat is provided in order to heat an object to be heated. As shown in FIGS. 1 and 2, one pair of introduction portions of current that is connected to the current-carrying part 3b is possible, and however, by setting this to be two pair or more, it becomes possible to control the heater independently by two zones or more.

It is preferable that as shown in FIG. 1(B) or FIG. 2(B), the heater pattern 3a is formed on the opposite surface of the plate portion 1a to the surface from which the rod portion 1b projects. However, according to purpose, as shown in FIG. 3(B)(D), the heater pattern may be formed on the surface of that side of the plate portion 1a from which the rod portion 1b projects, or may be formed on the both surfaces.

It is preferable that the heat-resistant base member 1 is a single piece comprising a plate portion 1a on which a heater pattern 3a is formed, a rod portion 1b which projects from one surface of the plate portion and on which the current-carrying part 3b is formed, an end portion 1c which is located in an opposite end of the rod portion to the plate portion 1a and on which a power-supply terminal 3c is formed;

a dielectric layer 2 with an insulating property is formed on a surface of the heat-resistant base member 1;

the conductive layer 3 is formed on the dielectric layer 2; and the protection layer 4 is integrally formed so as to cover surfaces of the heater pattern 3a and the current-carrying part 3b.

Because the heating portion 10a in which the heater pattern 3a is formed on the plate portion 1a and the power-supply-terminal portion 10c in which the power-supply terminal 3c is formed in the end portion 1c are separated by the rod portion 1b on which the current-carrying part 3b is formed, the power-supply terminal 3c exposed in the power-supply-terminal portion 10c comes to have a low temperature and becomes difficult to be worn away by a high-temperature gas in the process and the heating element has a long operation life.

Moreover, because the heat-resistant base member 1 is a single piece and is not assembled by combining a plurality of components, the member is compact and is produced at a low cost, and additionally, the layer(s) formed on the heat-resistant base member 1 become(s) difficult to be cracked by use and comes to have a long operation life.

Furthermore, in the conductive layer 3, as described above, the heater pattern 3a, the current-carrying part 3b, and the power-supply terminal 3c are formed and therefore, surfaces of the heater pattern 3a and the current-carrying part 3b are covered with the protection layer 4, and the conductive layer is integrally formed. Therefore, the heating element is compact and is produced at a low cost and additionally the protection layer 4 becomes difficult to be cracked by use and has a long-operation life.

It is preferable that the heat-resistant base member 1 is made of graphite because the material is inexpensive and easy to be processed even in a complex shape and therefore, the production cost can be lower and also its heat-resistance is large. However, another material such as sintered boron nitride is possible as long as having a heat resistance.

The plate portion 1a may be a heating portion 10a in which the dielectric layer 2, the heater pattern 3a, and the protection layer 4 are formed. The shape is not necessarily such a circular plate shape as shown in FIGS. 1 and 2 and may be a polygonal plate shape.

It is sufficient that the rod portion 1b projects from one surface of the plate portion 1a and can form the conductive portion 10b in which the dielectric layer 2, the current-carrying part 3b, the protection layer 4, and further thereon the corrosion-resistant layer 4p are formed as shown in FIG. 1(c). Its shape is not necessarily a circular column as shown in FIGS. 1 and 2, and may be a polygonal column. Moreover, the rod portion 1b may be one as shown in FIG. 1, may be two as shown in FIG. 2, or more. In the heating element in FIG. 2, the heater pattern 3a is formed on both surfaces of the plate portion 1a, and the heating element is made to turn on electricity and heated by the two rod portions 1b.

By setting a length of the rod portion 1b to be 10~200 mm, a sufficient distance between the terminal portion and the heating portion can be provided, and therefore, the terminal portion can have a sufficient low temperature, and the terminal portion can be more effectively prevented from being worn away.

It is preferable that the dielectric layer 2 is made of any one of boron nitride, pyrolytic boron nitride, silicon nitride, CVD silicon nitride, aluminum nitride, and CVD aluminum nitride, or a combination of any two or more of those. Thereby, its insulating property is high and there is no scattering of impurities in use at a high temperature and the heating element can also be used in a heating process in which high purity is required.

In the conductive layer 3, the heater pattern 3a is formed on the plate portion 1a, and the current-carrying portion 3b is formed on the rod portion 1b, and the power-supply terminal 3c is formed on the end portion 1c, and the surfaces of the heater pattern 3a and the current-carrying part 3b are covered with the protection layer 4 and the conductive layer 3 is integrally formed. Therefore, the heating element is compact and is produced at a low cost, and additionally the conductive layer 3 is not assembled by combining a plurality of components and therefore is difficult to be delaminated, and the protection layer 4 becomes difficult to be cracked near a connecting part of the components by use and has a long-operation life. In addition, in the present invention, the corrosion-resistant layer 4p is formed on the protection layer 4, and therefore, a corrosive gas does not transmit inside and does not degrade the conductive layer.

Furthermore, as shown in FIG. 3, it is preferable that the electrostatic chuck pattern 6 that is an electrode pattern supplying an electrostatic is provided and thereby an object to be heated becomes possible to be held. In particular, when the heater pattern 3a is formed on the surface of that side of the plate portion 1a from which the rod portion 1b projects, and the electrostatic chuck pattern 6 for holding an object to be heated is formed on the surface in the opposite side of the plate portion 1a, an object to be heated can be certainly held and heated and therefore, the heating position can be set high-precisely, and in such a case in which precision of the position of the object to be heated is required as ion implantation, plasma etching, sputtering, and so forth, a desired heating process can be performed more accurately. The pattern shape 6 of the electrostatic chuck can be, for example, comb-tooth shape, convolution shape, concentric circular shape, semicircular shape, lattice shape, wedgy shape, and so forth.

In the heating element 10 of the present invention as described above, a semiconductor wafer and such serving as the object to be heated are put on the heating portion 10a and the heating element 10 is electrically connected through the power terminal 5 and the heating is performed, and thereby, degradation due to corrosion of a conductive layer, particularly, a power-supply-terminal portion can be avoided even under an environment of a high temperature and a corrosive gas, and thereby it becomes possible that the heating element has a long operation life and is produced at a low cost.

Moreover, in the case of using the heating element as an electrostatic chuck, its resistivity can be set to a desired value and the heating element can exert a high chuck capability. Moreover, the held wafer is difficult to be damaged and to be broken.

Furthermore, when the heating portion 10a and the power-supply-terminal portion 10c are separated by the conductive portion 10b in which the current-carrying part 3b is formed on the rod portion 1b, the power-supply-terminal portion 10c comes to have a low temperature and becomes difficult to be worn away by a high-temperature gas in the process and comes to have a long operation life.

EXAMPLE

Hereinafter, the present invention will be explained more specifically with reference to Example and Comparative example. However, the present invention is not limited thereto.

Example 1

As shown in FIG. 1(D)(E), there was prepared the single-piece heat-resistant base member 1 made of carbon in which from the center of one surface of the plate portion 1a having a thickness of 10 mm and an external diameter of 250 mm, the rod portion 1b having a diameter of 30 mm and a length of 100 mm was formed and the end portion 1c that was a small circular plate having a diameter of 60 mm and thickness of 10 mm in the opposite side of the rod portion 1b to the plate portion 1a and that four holes each having a diameter of 6 mm being capable of connecting to the power terminal 5 were formed was formed.

The heat-resistant base member 1 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer made of pyrolytic graphite having a thickness of 0.1 mm was formed on the both surfaces by pyrolyzing a methane gas under the condition of 1800° C. and 3 Torr. Then, as shown in FIG. 3(A)(B), the conductive layer was processed so that the heater pattern 3a was formed on the back side of the heating surface of the plate portion, and the current-carrying part 3b was formed on the rod portion and the power-supply terminal 3c was formed on the end portion. Moreover, the electrostatic chuck pattern 6 was formed in the heating surface side of the plate portion by machining.

The power-terminal portion 3c was masked, and the base member was placed in a thermal CVD furnace again. By flowing the reactive gas whose volume mixture ratio of ammonium and boron trichloride was 4:1 and reacting them under the condition of 1900° C. and 1 Torr, the protection layer 4 with an insulating property made of pyrolytic boron nitride having a thickness of 0.1 mm was formed on the surfaces of the heater pattern 3a and the current-carrying part 3b. The resistivity of the protection layer 4 was measured at normal temperature and was found to be $1 \times 10^{12}$ Ω·cm.

Furthermore, as the corrosion-resistant layer 4p, an alumina layer of 20 µm was formed on the uppermost surface by reactive sputtering method with supplying hydrogen and oxygen at the same time. The alumina layer was an oxide having an oxygen amount of less than the stoichiometric ratio that was 2:2.3 with respect to the stoichiometric ratio of aluminum oxide ($Al_2O_3$) that is Al:O=2:3.

The resistivity of this layer that was formed on a graphite plate under the same condition was measured at normal temperature and was found to be $1 \times 10^{12}$ Ω·cm. Its Vickers hardness was 7.5 GPa (Vickers measurement: HV1 (load 9.8 N) JISR1610) and it could be confirmed that the resistivity was sufficiently low and also the hardness was sufficiently low. Its surface was polished so that its surface roughness Ra became 0.4 μm.

The heating element produced as described above was electrically connected and heated in vacuo of $1 \times 10^{-4}$ Pa and the heating portion could be heated to 300° C. with a power of 1.5 kw. In the case, the temperature of the power-supply-terminal portion became 150° C., which could be drastically lower than that of the heating portion.

Moreover, a silicon wafer was placed on the heating element and a power voltage of 500 V was applied and therefore, the wafer could be favorably adsorbed. This was repeated at 10000 times. However, wearing in the chuck surface could be only slightly observed and also the silicon wafers were not damaged. Thereby, it was confirmed that the resistivity of the corrosion-resistant layer became low and also the hardness became low and thereby the heating element could exert a high chuck capability.

$CF_4$ was introduced therein and the pressure was set to be $1 \times 10^{-2}$ Pa. However, for 200 hours, the heating could be performed without change. Thereby, it was confirmed that even under an environment of a high temperature and a corrosive gas, degradation due to corrosion of a conductive layer, particularly, a power-supply-terminal portion can be avoided.

Example 2

As shown in FIG. 2(C)(D), there was formed the single-piece heat-resistant base member 1 made of carbon in which from two places of both ends of one surface of the plate portion 1a having a thickness of 10 mm and an external diameter of 250 mm, one pair of the rod portions 1b each having a diameter of 20 mm and a length of 50 mm was formed and the end portions 1c in which female screw holes of M10 having a depth of 10 mm were formed in the opposite side of the rod portion 1b to the plate portion 1a so as to be capable of performing electrical connection by screw was formed.

The heat-resistant base member 1 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer made of pyrolytic graphite having a thickness of 0.1 mm was formed on the both surfaces by pyrolyzing a methane gas under the condition of 1800° C. and 3 Torr. Then as shown in FIG. 3(C)(D), the conductive layer was processed so that the heater pattern 3a was formed on the back side of the heating surface of the plate portion, and the current-carrying parts 3b were formed on the rod portion and the power-supply terminals 3c were formed on the end portion. Moreover, the electrostatic chuck pattern 6 was formed in the heating surface side of the plate portion by machining.

Then, the power-terminal portions 3c were masked, and the base member was placed in a thermal CVD furnace again. By flowing the reactive gas whose volume mixture ratio of ammonium, boron trichloride, and propane was 4:1:0.5 and reacting them under the condition of 1900° C. and 1 Torr, the protection layer 4 with an insulating property made of pyrolytic boron nitride having a thickness of 0.1 mm was formed on the surfaces of the heater pattern 3a and the current-carrying part 3b. The resistivity of the layer was measured at normal temperature and was found to be $1 \times 10^{11}$ Ω·cm.

In order to form the corrosion-resistant layer 4p thereon by thermal CVD method, yttrium complex was sublimated at 250° C., and an equal amount of nitrogen and hydrogen was introduced therein at 0.5 L/min and used as the carrier gas. Thereby, the sublimated gas of yttrium complex was blown and then the base member was heated to 500° C. in an atmospheric air, and in 2 hours, an yttria layer of 10 μm was formed as the corrosion-resistant layer 4p. The yttria layer was an oxide having an oxygen amount of less than the stoichiometric ratio that was 2:2.4 with respect to the stoichiometric ratio of yttria ($Y_2O_3$) that is Y:O=2:3.

The resistivity of this layer that was formed on a graphite plate under the same condition was measured at normal temperature and was found to be $1 \times 10^{13}$ Ω·cm. Its Vickers hardness was 6.5 GPa and it could be confirmed that the resistivity was sufficiently low and also the hardness was sufficiently low.

The heating element produced as described above was electrically connected and heated in vacuo of $1 \times 10^{-4}$ Pa and the heating portion could be heated to 400° C. with a power of 1.5 kw. In the case, the temperature of the power-supply-terminal portion became 150° C., which could be drastically lower than that of the heating portion.

Moreover, a silicon wafer was placed on the heating element and a power voltage of 500 V was applied and therefore, the wafer could be favorably adsorbed. This was repeated at 10000 times. However, wearing in the chuck surface could be only slightly observed and also the silicon wafers were not damaged. Thereby, it was confirmed that the resistivity of the corrosion-resistant layer became low and also the hardness became low and thereby the heating element could exert a high chuck capability.

$CF_4$ was introduced therein and the pressure was set to be $1 \times 10^{-2}$ Pa. However, for 200 hours, the heating could be performed without change. Thereby, it was confirmed that even under an environment of a high temperature and a corrosive gas, degradation due to corrosion of a conductive layer, particularly, a power-supply-terminal portion can be avoided.

Example 3

In order to form, by thermal CVD method, the corrosion-resistant layer 4p on the surface of the base member in which the steps until the formation of the protection layer 4 was performed by the same method as Example 2, yttrium complex was sublimated at 250° C., and nitrogen was introduced therein at 0.5 L/min, without hydrogen, and was used as the carrier gas. Thereby, the sublimated gas of yttrium complex was blown and then the base member was heated to 500° C. in an atmospheric air, and in 2 hours, an yttria layer of 10 μm was formed as the corrosion-resistant layer 4p. The ratio of the yttria layer was 2:3 with respect to the stoichiometric ratio of Y:O=2:3, and therefore, the yttria layer had no lack of oxygen.

The base member was put in a reducing furnace, and with flowing hydrogen at 2 L/min and nitrogen at 1 L/min, the temperature was raised to 1000° C. in 2 hr and then held for 2 hr and then the temperature was lowered. In this time, the ratio of the yttria layer was 2:2.6 with respect to the stoichiometric ratio of Y:Q=2:3, and therefore, the yttria layer had a lack of the oxygen amount of less than the stoichiometric ratio.

The resistivity of this layer that was formed on a graphite plate and reduced in the reducing furnace under the same condition was measured at normal temperature and was found to be $2\times10^{13}$ µcm. Its Vickers hardness was 5.5 GPa and it could be confirmed that the resistivity was sufficiently low and also the hardness was sufficiently low.

The heating element produced as described above was electrically connected and heated in vacuo of $1\times10^{-4}$ Pa and the heating portion could be heated to 400° C. with a power of 1.5 kw. In the case, the temperature of the power-supply-terminal portion became 200° C., which could be drastically lower than that of the heating portion.

Moreover, a silicon wafer was placed on the heating element and a power voltage of 500 V was applied and therefore, the wafer could be favorably adsorbed. This was repeated at 10000 times. However, wearing in the chuck surface could be only slightly observed and also the silicon wafers were not damaged. Thereby, it was confirmed that the resistivity of the corrosion-resistant layer became low and also the hardness became low and thereby the heating element could exert a high chuck capability.

$CF_4$ was introduced therein and the pressure was set to be $1\times10^{-2}$ Pa. However, for 200 hours, the heating could be performed without change. Thereby, it was confirmed that even under an environment of a high temperature and a corrosive gas, degradation due to corrosion of a conductive layer, particularly, a power-supply-terminal portion can be avoided.

Comparative Example

As shown in FIG. 4(C)(D), there was formed the heat-resistant base member 21 made of carbon in which in both ends of one surface of the plate-shaped base member 21 having a thickness of 10 mm and an external diameter of 250 mm, female screw holes of M10 having a depth of 10 mm were formed so as to be capable of performing electrical connection by screw. The screw portion of M10 was preliminarily formed largely at 0.4 mm so that the electrical connection could be subsequently performed by screw.

The heat-resistant base member 21 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer made of pyrolytic graphite having a thickness of 0.1 mm was formed on the both surfaces by pyrolyzing a methane gas under the condition of 1800° C. and 3 Torr. Then, a heater pattern was formed on the back side of the heating surface of the plate portion, and a electrostatic chuck pattern was formed in the heating surface side of the plate portion by machining. The both ends of the heater pattern were processed so as to form power-supply terminals.

Then, the power-terminal portions 3c were masked, and the base member was placed in a thermal CVD furnace again. By flowing the reactive gas whose volume mixture ratio of ammonium and boron trichloride was 4:1 and reacting them under the condition of 1900° C. and 1 Torr, the protection layer 4 with an insulating property made of pyrolytic boron nitride having a thickness of 0.1 mm was formed on the surfaces of the heater pattern 3a.

In order to form a corrosion-resistant layer thereon by thermal CVD method, yttrium complex was sublimated at 250° C., and only nitrogen at 0.5 L/min was used as the carrier gas without hydrogen. Thereby, the sublimated gas of yttrium complex was blown and then the base member was heated to 500° C. in an atmospheric air, and in 2 hours, an yttria layer of 10 µm was formed as the corrosion-resistant layer. The ratio of the yttria layer was 2:3 with respect to the stoichiometric ratio of Y:O=2:3, and therefore, the yttria layer had no lack of oxygen.

The resistivity of this layer that was formed on a graphite plate under the same condition was measured at normal temperature and was found to be $1\times10^{14}$ Ω·cm or more. Its Vickers hardness was 11 GPa and it could be confirmed that the resistivity was high and also the hardness was large.

The heating element 20 in FIG. 4 produced as described above was electrically connected and heated in vacuo of $1\times10^{-4}$ Pa and the heating portion could be heated to 500° C. with a power of 1.5 kw. In the case, the temperature of the power-supply-terminal portion was 400° C., which could hardly be prevented from being heated.

Moreover, a silicon wafer was placed on the heating element and a power voltage of 500 V was applied and therefore, displacement was occasionally caused due to shortage of the adsorbability. This was repeated at 10000 times. Therefore, wearing in the chuck surface was not observed. However, the silicon wafers were drastically damaged.

The present invention is not limited to the above-described embodiments. The above-described embodiments are mere examples and those having the substantially same constitution as that described in the appended claims and providing the similar functions and advantages are included in the scope of the present invention.

For example, in Example, yttria and alumina has been exemplified as the corrosion-resistant layer that is the oxide having an oxygen amount of stoichiometric ratio or less. However, the corrosion-resistant layer is not limited thereto, and when the layer is a silicon oxide, the same effect can be obtained.

What is claimed is:

1. A heating element comprising: at least
   a heat-resistant base member;
   a conductive layer having a heater pattern formed on the heat-resistant base member;
   a protection layer with an insulating property formed on the conductive layer; and
   a corrosion-resistant layer that is an oxide having an oxygen amount of stoichiometric ratio or less formed on the protection layer.

2. The heating element according to claim 1, wherein on an opposite surface to a surface of the heat-resistant base member on which the heater pattern is formed, an electrostatic chuck pattern for holding an object to be heated is formed, and on the electrostatic chuck pattern, the protection layer and the corrosion-resistant layer are formed.

3. The heating element according to claim 1, wherein the oxide is any one of an oxide of aluminum, an oxide of yttrium, and an oxide of silicon, or a combination of any two or more of those.

4. The heating element according to claim 2, wherein the oxide is any one of an oxide of aluminum, an oxide of yttrium, and an oxide of silicon, or a combination of any two or more of those.

5. The heating element according to claim 1, wherein when the stoichiometric ratio of oxygen of the oxide is set to 1, the oxygen amount is 0.6 or more and less than 1.

6. The heating element according to claim 2, wherein when the stoichiometric ratio of oxygen of the oxide is set to 1, the oxygen amount is 0.6 or more and less than 1.

7. The heating element according to claim 3, wherein the stoichiometric ratio of oxygen of the oxide is set to 1, the oxygen amount is 0.6 or more and less than 1.

8. The heating element according to claim 4, wherein when the stoichiometric ratio of oxygen of the oxide is set to 1, the oxygen amount is 0.6 or more and less than 1.

9. The heating element according to claim 1, wherein the corrosion-resistant layer is formed by any one of CVD method, spraying method, reactive sputtering method, and sol-gel method, or a combined method of those.

10. The heating element according to claim 5, wherein the corrosion-resistant layer is formed by any one of CVD method, spraying method, reactive sputtering method, and sol-gel method, or a combined method of those.

11. The heating element according to claim 8, wherein the corrosion-resistant layer is formed by any one of CVD method, spraying method, reactive sputtering method, and sol-gel method, or a combined method of those.

12. The heating element according to claim 1, wherein the corrosion-resistant layer is treated with an atmosphere containing a reducing gas.

13. The heating element according to claim 5, wherein the corrosion-resistant layer is treated with an atmosphere containing a reducing gas.

14. The heating element according to claim 11, wherein the corrosion-resistant layer is treated with an atmosphere containing a reducing gas.

15. The heating element according to claim 1, wherein surface roughness Ra of an outermost surface of the corrosion-resistant layer is 1 µm or less.

16. The heating element according to claim 5, wherein surface roughness Ra of an outermost surface of the corrosion-resistant layer is 1 µm or less.

17. The heating element according to claim 14, wherein surface roughness Ra of an outermost surface of the corrosion-resistant layer is 1 µm or less.

18. The heating element according to claim 1, wherein resistivity of an outermost surface of the corrosion-resistant layer is $10^8 \sim 10^{13}$ Ω·cm (room temperature).

19. The heating element according to claim 5, wherein resistivity of an outermost surface of the corrosion-resistant layer is $10^8 \sim 10^{13}$ Ω·cm (room temperature).

20. The heating element according to claim 17, wherein resistivity of an outermost surface of the corrosion-resistant layer is $10^8 \sim 10^{13}$ Ω·cm (room temperature).

21. The heating element according to claim 1, wherein a Vickers hardness of an outermost surface of the corrosion-resistant layer is 1 GPa to 8 GPa.

22. The heating element according to claim 5, wherein a Vickers hardness of an outermost surface of the corrosion-resistant layer is 1 GPa to 8 GPa.

23. The heating element according to claim 20, wherein a Vickers hardness of an outermost surface of the corrosion-resistant layer is 1 GPa to 8 GPa.

24. The heating element according to claim 1, wherein the protection layer is made of any one of boron nitride, pyrolytic boron nitride, silicon nitride, CVD silicon nitride, aluminum nitride, and CVD aluminum nitride, or a combination of any two or more of those.

25. The heating element according to claim 5, wherein the protection layer is made of any one of boron nitride, pyrolytic boron nitride, silicon nitride, CVD silicon nitride, aluminum nitride, and CVD aluminum nitride, or a combination of any two or more of those.

26. The heating element according to claim 23, wherein the protection layer is made of any one of boron nitride, pyrolytic boron nitride, silicon nitride, CVD silicon nitride, aluminum nitride, and CVD aluminum nitride, or a combination of any two or more of those.

27. The heating element according to claim 1, wherein the conductive layer is made of pyrolytic carbon or grassy carbon.

28. The heating element according to claim 5, wherein the conductive layer is made of pyrolytic carbon or grassy carbon.

29. The heating element according to claim 26, wherein the conductive layer is made of pyrolytic carbon or grassy carbon.

30. The heating element according to claim 1: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and
the protection layer is integrally formed so as to cover surfaces of the heater pattern and the current-carrying part.

31. The heating element according to claim 5: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and
the protection layer is integrally formed so as to cover surfaces of the heater pattern and the current-carrying part.

32. The heating element according to claim 29: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and
the protection layer is integrally formed so as to cover surfaces of the heater pattern and the current-carrying part.

33. The heating element according to claim 30, wherein the heat-resistant base member is made of graphite.

34. The heating element according to claim 31, wherein the heat-resistant base member is made of graphite.

35. The heating element according to claim 32, wherein the heat-resistant base member is made of graphite.

36. The heating element according to claim 30, wherein the dielectric layer is made of any one of boron nitride, pyrolytic boron nitride, silicon nitride, CVD silicon nitride, aluminum nitride, and CVD aluminum nitride, or a combination of any two or more of those.

37. The heating element according to claim 31, wherein the dielectric layer is made of any one of boron nitride, pyrolytic boron nitride, silicon nitride, CVD silicon nitride, aluminum nitride, and CVD aluminum nitride, or a combination of any two or more of those.

38. The heating element according to claim 35, wherein the dielectric layer is made of any one of boron nitride, pyrolytic boron nitride, silicon nitride, CVD silicon nitride, aluminum nitride, and CVD aluminum nitride, or a combination of any two or more of those.

39. The heating element according to claim 30, wherein a length of the rod portion is 10~200 mm.

40. The heating element according to claim 31, wherein a length of the rod portion is 10~200 mm.

41. The heating element according to claim 38, wherein a length of the rod portion is 10~200 mm.

42. The heating element according to claim 30, wherein the heater pattern is formed on the surface of that side of the plate portion from which the rod portion projects, and the electrostatic chuck pattern for holding an object to be heated is formed on the surface in the opposite side of the plate portion.

43. The heating element according to claim 31, wherein the heater pattern is formed on the surface of that side of the plate portion from which the rod portion projects, and the electrostatic chuck pattern for holding an object to be heated is formed on the surface in the opposite side of the plate portion.

44. The heating element according to claim 41, wherein the heater pattern is formed on the surface of that side of the plate portion from which the rod portion projects, and the electrostatic chuck pattern for holding an object to be heated is formed on the surface in the opposite side of the plate portion.

* * * * *